(12) United States Patent
Dell'Ova et al.

(10) Patent No.: US 7,704,757 B2
(45) Date of Patent: Apr. 27, 2010

(54) METHOD FOR ADJUSTING AN ELECTRICAL PARAMETER ON AN INTEGRATED ELECTRONIC COMPONENT

(75) Inventors: Francis Dell'Ova, Fuveau (FR); Frank Lhermet, La Ciotat (FR); Dominique Poirot, Auriol (FR); Stephane Rayon, Avenue de la Marine (FR); Bertrand Gomez, Roquevaire (FR); Nicole Lessoile, Auriol (FR); Pierre Rizzo, Aubagne (FR)

(73) Assignee: STMicroelectronics S.A., Montrouge (FR)

( * ) Notice: Subject to any disclaimer, the term of this patent is extended or adjusted under 35 U.S.C. 154(b) by 2034 days.

(21) Appl. No.: 10/276,509

(22) PCT Filed: Mar. 13, 2001

(86) PCT No.: PCT/FR01/00750

§ 371 (c)(1),
(2), (4) Date: Aug. 1, 2003

(87) PCT Pub. No.: WO01/69671

PCT Pub. Date: Sep. 20, 2001

(65) Prior Publication Data

US 2004/0023482 A1    Feb. 5, 2004

(30) Foreign Application Priority Data

Mar. 14, 2000  (FR) .................................. 00 03260

(51) Int. Cl.
*H01L 21/00* (2006.01)
*G06F 19/00* (2006.01)

(52) U.S. Cl. .................... 438/10; 700/121; 257/679; 257/E23.064; 257/E23.176

(58) Field of Classification Search .................. 700/121; 438/5, 10, 11, 14, 17, 18; 257/679, E23.064, 257/E23.176
See application file for complete search history.

(56) References Cited

U.S. PATENT DOCUMENTS 5,079,600 A * 1/1992 Schnur et al. ............... 257/750

\* cited by examiner

*Primary Examiner*—Sue Purvis
*Assistant Examiner*—Monica D Harrison
(74) *Attorney, Agent, or Firm*—Lisa K. Jorgenson; Stephen Bongini; Fleit Gibbons Gutman Bongini & Bianco P.L.

(57) ABSTRACT

A method is provided for manufacturing an integrated electronic component arranged on a substrate wafer. According to the method, at least one metallization step is performed, and a value of an electrical parameter of the integrated electronic component is determined after the at least one metallization step. A subsequent metallization step is performed after determining the value of the electrical parameter. The subsequent metallization step is performed using an adjustment mask chosen from n predefined masks based on a desired value of the electrical parameter, so as to obtain the desired value of the electrical parameter of the integrated electronic component after manufacturing. In one preferred embodiment, a series of electrical tests is performed on the wafer using test equipment, and the value of the electrical parameter is determined using the same test equipment as is used to perform the series of electrical tests.

19 Claims, 1 Drawing Sheet

METHOD FOR ADJUSTING AN ELECTRICAL PARAMETER ON AN INTEGRATED ELECTRONIC COMPONENT

The present invention relates to a method of manufacturing an integrated electronic component, comprising a step for adjusting the value of a parameter of the component to a desired value, or at least for reducing the dispersion (spread) of that value with respect to the desired value.

This method can thus be implemented for reducing the dispersion of a capacitance or resistance value, or of any other electrical parameter of the integrated component.

The method in accordance with the invention is applicable to all types of electronic components. However, its applications are particularly advantageous in the field of contactless IC cards (also known as chip cards or smart cards) and electronic labels or tags, or badges. These contactless communicating devices generally comprise a microcircuit connected to an L-C type resonant circuit. In practice, this circuit is formed by an external antenna L connected in parallel to a capacitor C of the microcircuit.

This type of component operates on the auto-powering principle, in which the energy extracted from a radio frequency carrier is stored in a capacitor C'.

Indeed, contactless devices operate on the basis of a radio frequency (RF) communication with an interrogating read and/or write device, generally designated by the term reader.

As an example, in some contactless IC card applications, the reader transmits a signal having a carrier-frequency of 13.56 MHz.

This transmitted signal firstly enables to power the contactless device, which thus obtains by induction the energy required for its operation. Secondly, this RF signal serves to set up a communication with the contactless device according to an established protocol. The quality and reliability of this communication are directly linked, among other things, to the distance between the reader and the contactless device.

The distance, or range, for the RF communication between the reader and the contactless device depends on several parameters. Indeed, the quality of communication depends on the match in frequency between the contactless device's resonant circuit and the transmission frequency of the signal from the reader. Thus, the better is the match between the resonant frequency of the oscillating circuit and the RF transmission frequency, the greater is the communication range.

In the context of some applications which require a range of 50 cm to 1 m, for example, the resonant circuit must be very accurately matched to the signal's carrier frequency.

Tuning of the resonant circuit necessarily involves an adjustment of electrical, parameters of the components which form that circuit, namely the antenna of the device and the capacitor of the microcircuit.

The intrinsic precision of an antenna at its manufacture is on the order of 2%, whereas that of the, capacitor of an integrated circuit can attain 20%. It is then clear that adjustment of the capacitor is indispensable to the manufacture of long range radio frequency devices.

In the prior art, there exist techniques allowing to reach a precise value in a given technological parameter, such as resistance, capacitance, or other.

Indeed, when the manufacturing process does not allow to reach the desired precision, it is normal practice to have recourse to either an electrical adjustment, e.g. by burning a fuse, or by a mechanical adjustment, e.g. by laser cutting.

The technique of mechanical adjustment by laser is very costly and complex to implement.

The technique of electrical adjustment by implementing trimming capacitors or resistors and by fuse burning or connection by transmission gates involves additional costs in terms of surface occupied on the component, or circuitry produced, and in manufacturing costs. Moreover, the use of such a technique increases the series resistance of the capacitor, which is detrimental to the quality factor of the resonant circuit and leads to a loss of range.

It has also been envisaged to produce capacitors in double polymer in order to have good control of thickness, and hence of the exact capacitance value, but this technology is expensive to implement.

There has been proposed another solution which consists in implementing a plurality of small adjustment—trimming—capacitors and commanding the connection or disconnection of those trimming capacitors to the main capacitor through a program stored in non-volatile memory (e.g. an EEPROM) of the radio frequency device each time the latter is placed before the reader.

However, this technique has the drawback of having an asymmetrical behavior with respect to the range. Indeed, the capacitor adjustment program can only be executed when the RF device is electrically powered, i.e. when the latter is coupled to the reader. Accordingly, when the RF device penetrates into the field of the reader, the capacitor is not yet adjusted, for the adjustment program has not been executed and the tuning is not yet achieved. On the other hand, after adjustment, the device is detected for a long time by the reader.

The present invention has for object to overcome these drawbacks of the prior art, and of proposing a low-cost electronic parameter adjustment method for an integrated electronic component, such as a microcircuit, a detector or a transistor for example.

The present invention has for object a manufacturing method which enables to adjust, at lower cost, an electrical parameter with a precision of better than 3%.

The present invention more particularly has for object a method of manufacturing an integrated electronic component arranged on a substrate wafer, comprising at least two metallization steps, mainly characterized in that the value of an electrical parameter of the component is determined after a metallization step, and in that a subsequent metallization is performed with an adjustment mask addressed among n predefined masks to obtain a desired value of the parameter, the choice of adjustment mask being made in accordance with the determined value of the electrical parameter.

According to a first embodiment, the method comprises a step of electrical tests, the value of the electrical parameter to adjust is measured with equipment identical to that used for the tests.

According to another embodiment, the method comprises a step of optical measurement performed prior to the metallization steps, the value of the electrical parameter to adjust is extrapolated from that optical measurement.

According to a first application, the electrical parameter to adjust is the intrinsic capacitance of the component.

According to another application, the electrical parameter to adjust is the intrinsic resistance of the component.

According to, another characteristic, the same adjustment mask is used for all the components arranged on wafers originating from a same fabrication batch.

According to another characteristic, the number of adjustment masks is comprised between 2 and 7, so as to obtain a dispersion in the value of the electrical parameter to adjust less than or equal to 3%.

According to an advantageous application of the method, the electronic component is a microcircuit for a device communicating by radio frequency.

The method according to the invention allows to adjust the value of an electrical parameter with a precision on the order of 2.5%, without significant additional cost in the fabrication of the component.

As shall appear from the exemplary embodiment described in what follows, the need to produce n masks, instead of just one, according to the invention is not a drawback having regard to the result achieved and to the volume of components produced.

On a separate account, the management of the choice of the appropriate mask (addressing one mask out of n) does not pose major difficulties, for there exist many well controlled software routines for addressing n products in the prior art.

Moreover, the mask chosen out of n adjustment masks can be used for all the wafers coming from a same fabrication batch (lot), since statistically the dispersion within a same batch (around 50 wafers) is low, being on the order of 1%.

Other specific aspects and advantages of the present invention shall become apparent from the following description, given as an illustrative and non-limiting example with reference to the single drawing illustrating the steps of the fabrication process in accordance with the invention.

Figure 1:
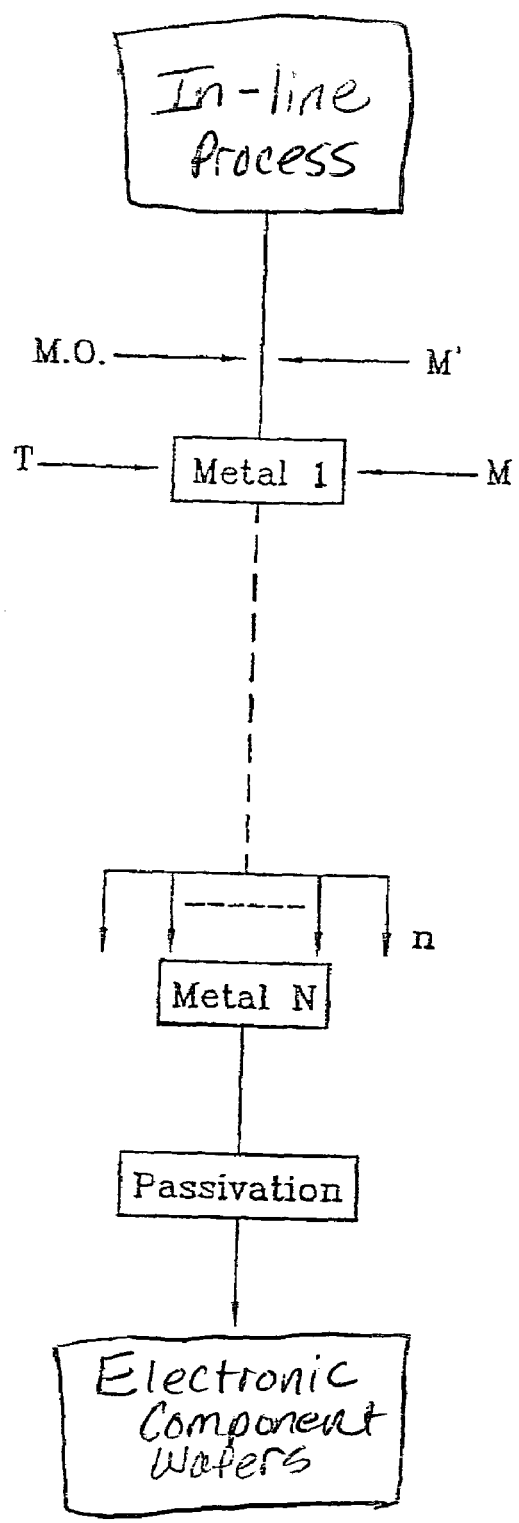
FIG. 1 illustrates the steps of the fabrication process in accordance with the invention.

The method according to the invention can easily be integrated into a classical in-line fabrication process for a set of electronic components arranged on a semiconductor substrate wafer.

Classical fabrication processes for electronic components arranged on substrate wafers, for example made of silicon, generally comprise at least two metallization steps. There is even a tendency at present towards more and more complex technologies comprising four to five metallization steps.

The aim of the invention is to allow adjustment of at least one electrical parameter of the component. To this end, a first step comprises determining the value of that parameter to adjust, prior to the final metallization of the wafer.

In accordance with a first embodiment, the value of the parameter to adjust can advantageously be measured after the first metallization, Metal 1.

According to the processes used, the measurement M can be performed at the same time as another series of electrical tests T. These tests T are normally planned to take place during classical processes for the fabrication of integrated component wafers.

In a double metallization technology, these tests are generally performed after the second metallization step Metal 2. For implementing the method subject of the invention, it is then necessary to modify slightly the fabrication procedure to carry out the measurement M after the first metallization step Metal 1. However, if a technology involving more than two metallizations is used, the tests are generally conducted during step Metal 1, and no modification need be brought to implement the invention.

Performing an additional measurement, be it of capacitance, resistance, or any other electrical parameter to adjust, poses no problem and modifies little, if at all, the classical fabrication processes.

Moreover, the measurement M, just as for classical electrical tests T, is generally carried out at five points of the wafer, and not on each electrical component. Indeed, it has been established statistically that the dispersion of the an electrical parameter on the components of a same wafer is low, being on the order of around 1%. Moreover, the dispersion of that parameter on all the wafers of a same batch is equally low. This value M can thus be kept for all the wafers of a same batch.

Consequently, it is possible to conduct only five measurements to extract therefrom an average measurement M, and then to carry out the same adjustment on all the components of a same batch of wafers.

In accordance with another embodiment, the value of the parameter to adjust can be extrapolated from a measurement M' that is carried out prior to metallization steps.

For example, it can be envisaged to establish a correlation between the optical measurement of the wafer's oxide thickness MO, this measurement being made during a classical in-line process, and the capacitance value of the components arranged on that wafer according to the so-called ellipsometry technique, for example. The adjustment shall then be the same for all components of a same batch of wafers.

The method according to the invention then comprises a step of accurately adjusting the desired electrical parameter for all the components arranged on the wafers of a same batch.

If the method comprises N metallization steps (metallizations)i with N taking values from 2 to 5 nowadays, the adjustment step is advantageously performed during the wafer's last metallization step, Metal N.

Depending on the value of the parameter to adjust, whether it be measured M or extrapolated M', a mask metal N among n predefined masks is selected to produce the last metallization, and thus adjust the parameter so as to obtain a precision better than 3%. The addressing of a mask among n is possible by means of a software routine which is simple and perfectly mastered in the state of the art. In order not to modify the existing in-line fabrication management program, the function of the software routine is to code n distinct products from one single product, then to recode a single product (the selected mask) for that last metallization step.

Depending on the dispersion in the value of the parameter to adjust and the desired precision, the number n of adjustment masks takes a value from 2 to 7.

Accordingly, for example, in order to adjust the intrinsic capacitance of a component whose dispersion during the fabrication of different wafer batches can reach 20%, seven adjustment masks need to be addressed to obtain a precision of 3% in that intrinsic capacitance of the finished component.

The in-line fabrication process then continues, following on with the classical steps up to the passivation of the wafer.

After multiple uses of the method in accordance with the invention, the parameters to be adjusted can be re-centered as a function of the values most frequently determined, by measurement or extrapolation. This re-centering can advantageously allow to reduce the number of adjustment masks in order to optimize the method.

The invention claimed is:

1. A method of manufacturing an integrated electronic component arranged on a substrate wafer, said method comprising the steps of:
   performing at least one metallization step;
   determining a value of an electrical parameter of the integrated electronic component after the at least one metallization step; and
   performing a subsequent metallization step after determining the value of the electrical parameter, the subsequent metallization step being performed using an adjustment mask chosen from n predefined masks based on a desired value of the electrical parameter, so as to obtain the desired value of the electrical parameter of the integrated electronic component after manufacturing.

2. The method according to claim 1, further comprising the step of:

performing a series of electrical tests on the water using test equipment, wherein the value of the electrical parameter of the integrated electronic component is determined using the test equipment used to perform the series of electrical tests.

3. The method according to claim 1, further comprising the step of:

performing at least one optical measurement before the at least one metallization step, wherein the value of the electrical parameter of the integrated electronic component is determined by extrapolating from the optical measurement.

4. The method according to claim 1, wherein the electrical parameter is an intrinsic capacitance of the integrated electronic component.

5. The method according to claim 1, wherein the electrical parameter is an intrinsic resistance of the integrated electronic component.

6. The method according to claim 1, further comprising the step of using the chosen adjustment mask for all wafers in a fabrication batch of wafers.

7. The method according to claim 1, wherein n is from 2 to 7.

8. The method according to claim 1, wherein n is chosen so as to obtain a dispersion in the value of the electrical parameter of less than or equal to 3%.

9. The method according to claim 1, wherein the electronic component is a microcircuit for a device that communicates by radio frequency.

10. The method according to claim 1, wherein the electronic component is a capacitor in an integrated circuit for a contactless IC card.

11. A machine-readable medium encoded with a program for manufacturing an integrated electronic component arranged on a substrate wafer, said program containing instructions for performing the steps of:

performing at least one metallization step;

determining a value of an electrical parameter of the integrated electronic component after the at least one metallization step; and performing a subsequent metallization step after determining the value of the electrical parameter, the subsequent metallization step being performed using an adjustment mask chosen from n predefined masks based on a desired value of the electrical parameter, so as to obtain the desired value of the electrical parameter of the integrated component after manufacturing.

12. The machine-readable medium according to claim 11, wherein the program further contains instructions for performing the step of:

performing a series of electrical tests on the wafer using test equipment, wherein the value of the electrical parameter of the integrated electronic component is determined using the test equipment used to perform the series of electrical tests.

13. The machine-readable medium according to claim 11, wherein the program further contains instructions for performing the step of:

performing at least one optical measurement before the at least one metallization step, wherein the value of the electrical parameter of the integrated electronic component is determined by extrapolating from the optical measurement.

14. The machine-readable medium according to claim 11, wherein the electrical parameter is an intrinsic capacitance of the integrated electronic component.

15. The machine-readable medium according to claim 11, wherein the electrical parameter is an intrinsic resistance of the integrated electronic component.

16. The machine-readable medium according to claim 11, wherein the program further contains instructions for performing the step of using the chosen adjustment mask for all wafers in a fabrication batch of wafers.

17. The machine-readable medium according to claim 11, wherein n is from 2 to 7.

18. The machine-readable medium according to claim 11, wherein n is chosen so as to obtain a dispersion in the value of the electrical parameter of less than or equal to 3%.

19. The machine-readable medium according to claim 11, wherein the electronic component is a microcircuit for a device that communicates by radio frequency.

* * * * *